United States Patent
Al-Shareef et al.

(10) Patent No.: US 6,191,443 B1
(45) Date of Patent: *Feb. 20, 2001

(54) CAPACITORS, METHODS OF FORMING CAPACITORS, AND DRAM MEMORY CELLS

(75) Inventors: Husam N. Al-Shareef; Scott Jeffrey DeBoer, both of Boise; F. Daniel Gealy, Kuna, all of ID (US); Randhir P. S. Thakur, San Jose, CA (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 43 days.

(21) Appl. No.: 09/033,063

(22) Filed: Feb. 28, 1998

(51) Int. Cl.$^7$ ................................................... H01L 29/72

(52) U.S. Cl. ...................... 257/310; 257/301; 257/303; 257/532; 257/640

(58) Field of Search .................................. 257/310, 301, 257/303, 532, 640

(56) References Cited

U.S. PATENT DOCUMENTS

| | | |
|---|---|---|
| 4,333,808 | 6/1982 | Bhattacharyya et al. . |
| 4,464,701 | 8/1984 | Roberts et al. . |

(List continued on next page.)

FOREIGN PATENT DOCUMENTS

| | | | |
|---|---|---|---|
| 1-222469 | 9/1989 | (JP) . | |
| 5-221644 | 8/1993 | (JP) . | |
| 405343641 | 12/1993 | (JP) | ........................ 257/310 |
| 6-021333 | 1/1994 | (JP) . | |

OTHER PUBLICATIONS

S. Wolf and R.N. Tauber, *Silicon Processing for the VLSI Era*, vol. 2, Lattice Press, pp. 589–591.

M.A. Farooq, S.P. Muraraka, C.C. Chang, F.A. Baiocchi, Tantalum nitride as a dissusion barrier between $Pd_2Si$, CoSi2 and aluminum, 1989 American Institute of Physics, pp. 3017–3022.

U.S. application No. 09/229,518, DeBoer et al.

U.S. application No. 08/670,644, Graettinger.

U.S. application No. 08/542, 430, Schuegraf, filed Jan. 13, 1999.

Shigeo Onishi et al.; "A Half–Micron Ferroelectric Memory Cell Technology with Stacked Capacitor Structure"; IEEE, 1994; pp. 34.4.1–34.4.4–Jan.

Satoshi Kamiyama et al.; "Highly Reliable 2.5nm $Ta_2O_5$ Capacitor Process Technology for 256Mbit DRAMs"; IEEE, 1991; pp. 32.2.1–32.2.4–Jan.

(List continued on next page.)

*Primary Examiner*—Edward Wojciehowicz
(74) *Attorney, Agent, or Firm*—Wells, St. John, Roberts, Gregory & Matkin P.S.

(57) ABSTRACT

Capacitors and methods of forming capacitors are disclosed. In one implementation, a capacitor comprises a capacitor dielectric layer comprising $Ta_2O_5$ formed over a first capacitor electrode. A second capacitor electrode is formed over the $Ta_2O_5$ capacitor dielectric layer. Preferably, at least a portion of the second capacitor electrode is formed over and in contact with the $Ta_2O_5$ in an oxygen containing environment at a temperature of at least about 175° C. Chemical vapor deposition is one example forming method. The preferred second capacitor electrode comprises a conductive metal oxide. A more preferred second capacitor electrode comprises a conductive silicon comprising layer, over a conductive titanium comprising layer, over a conductive metal oxide layer. A preferred first capacitor electrode comprises a conductively doped Si-Ge alloy. Preferably, a $Si_3N_4$ layer is formed over the first capacitor electrode. DRAM cells and methods of forming DRAM cells are disclosed.

7 Claims, 3 Drawing Sheets

U.S. PATENT DOCUMENTS

| | | | |
|---|---|---|---|
| 4,891,682 | 1/1990 | Yusa et al. | 357/30 |
| 4,952,904 | 8/1990 | Johnson et al. | |
| 5,053,917 | 10/1991 | Miyasaka et al. | 361/321 |
| 5,079,191 | 1/1992 | Shinriki et al. | 437/235 |
| 5,111,355 | 5/1992 | Anand et al. | |
| 5,142,438 | 8/1992 | Reinberg et al. | 361/313 |
| 5,191,510 | 3/1993 | Huffman | 361/313 |
| 5,234,556 | 8/1993 | Oishi et al. | 204/157.51 |
| 5,279,985 | 1/1994 | Kamiyama | |
| 5,293,510 | 3/1994 | Takenaka | 257/295 |
| 5,316,982 | 5/1994 | Taniguchi | 437/236 |
| 5,330,935 | 7/1994 | Dobuzinsky et al. | 437/239 |
| 5,335,138 | 8/1994 | Sandhu et al. | |
| 5,348,894 | 9/1994 | Gnade et al. | |
| 5,352,623 | 10/1994 | Kamiyama | 437/52 |
| 5,362,632 | 11/1994 | Mathews | 437/47 |
| 5,372,859 | 12/1994 | Thakoor | 427/551 |
| 5,397,446 | 3/1995 | Ishihara et al. | |
| 5,442,213 | 8/1995 | Okudaira et al. | |
| 5,466,629 | 11/1995 | Mihara et al. | 437/60 |
| 5,468,687 | 11/1995 | Carl et al. | 437/235 |
| 5,471,364 | 11/1995 | Summerfelt et al. | |
| 5,504,041 | * 4/1996 | Summerfelt | 257/296 |
| 5,508,953 | 4/1996 | Fukuda et al. | 365/145 |
| 5,510,651 | 4/1996 | Maniar et al. | 257/751 |
| 5,552,337 | 9/1996 | Kwon et al. | |
| 5,555,486 | 9/1996 | Kingon et al. | 361/305 |
| 5,561,307 | 10/1996 | Mihara et al. | 257/295 |
| 5,585,300 | 12/1996 | Summerfelt | |
| 5,617,290 | 4/1997 | Kulwicki et al. | |
| 5,641,703 | 6/1997 | Imai et al. | |
| 5,654,222 | 8/1997 | Sandhu et al. | |
| 5,663,088 | 9/1997 | Sandhu et al. | |
| 5,688,724 | 11/1997 | Yoon et al. | |
| 5,728,603 | 3/1998 | Emesh et al. | |
| 5,780,359 | 7/1998 | Brown et al. | |
| 5,786,248 | 7/1998 | Schuegraf | 438/240 |
| 5,790,366 | 8/1998 | Desu et al. | 361/305 |
| 5,798,903 | 8/1998 | Dhote et al. | 361/321.4 |
| 5,807,774 | 9/1998 | Desu et al. | |
| 5,814,852 | 9/1998 | Sandhu et al. | 257/310 |
| 5,834,345 | 11/1998 | Shimizu | |
| 5,837,591 | 11/1998 | Shimada et al. | |
| 5,837,593 | 11/1998 | Park et al. | |
| 5,838,035 | 11/1998 | Ramesh | |
| 5,843,830 | 12/1998 | Graettinger et al. | 438/396 |
| 5,844,771 | 12/1998 | Graettinger et al. | 361/303 |
| 5,888,295 | 3/1999 | Sandhu et al. | |
| 5,899,740 | 5/1999 | Kwon | |
| 5,910,218 | 6/1999 | Park et al. | |
| 5,910,880 | 6/1999 | DeBoer et al. | |
| 5,916,634 | 6/1999 | Fleming et al. | |
| 5,930,584 | 7/1999 | Sun et al. | |
| 5,933,316 | 8/1999 | Ramakrishnan et al. | |
| 5,970,369 | 10/1999 | Hara et al. | |
| 5,990,507 | 11/1999 | Mochizuki et al. | |
| 6,010,744 | 1/2000 | Buskirk et al. | |
| 6,015,989 | 1/2000 | Horikawa et al. | |
| 6,027,969 | 2/2000 | Huang et al. | |
| 6,028,360 | 2/2000 | Nakamura et al. | |
| 6,046,469 | 4/2000 | Yamazaki et al. | |
| 6,051,859 | 4/2000 | Hosotani et al. | |

OTHER PUBLICATIONS

T. Eimori et al.; "A Newly Designed Planar Stacked Capacitor Cell with High Dielectric Film for 256Mbit DRAM"; IEEE, 1993;–Jan. pp. 26.3.1–26.3.4.

Wolf, Stanley; "One–Transistor DRAM Cell Design"; Silicon Processing for the VLSI Era, 1990; pp. 589–591–Jan.

Hiromu Yamaguchi; "Structural and Electrical Characterization of $SrTiO_3$ Thin Films Prepared by Metal Organic Chemical Vapor Deposition"; *Jpn. J. Appl. Phys.* vol. 32 (1993) Pt.1, No. 98, pp. 4069–4073–Jan.

M. A. Farooq et al.; "Tantalum nitride as a diffusion barrier between $Pd_xSi$, $CoSi_2$ and aluminum"; 1989 American Institute of Physics; pp. 3017–3022–Jan.

U.S. application No. 08/994,054, Parekh et al., Dec. 19, 1997.

Satashi Kamiyama et al.; "Ultrathin Tantalum Oxide Capacitor Dielectric Layers Fabricated Using Rapid Thermal Nitridation prior to Low Pressure Chemical Vapor deposition"; The Electrochemical Society, Inc., vol. 140, No. 6, 1993; pp. 1617–1625–Jan.

Fazan et al, IEDM 92, pp. 263–266, Apr. 1992.*

Lesaicherre et al, IDEM 94, pp. 831–834, Jan. 1994.*

H. Shinriki and M. Nakata, IEEE Transaction On Electron Devices, vol. 38 No. 3, Mar. 1991.

H. Shinriki and M. Nakata, IEEE Transaction On Electron Devices vol 38 No 3 Mar. 1991.

McIntyre, Paul C. et al., "Kinetics And Mechanisms Of TiN Oxidation Beneath Pt/TiN Films", *J. Appl. Phys.*, vol. 82, No. 9, pp. 4577–4585 (Nov. 1997).

U.S. application No. 09/059,057, Agarwal et al., filed Apr. 10, 1998.

U.S. application No. 09/033,064, Al–Shareef et al., filed Feb. 28, 1998.

U.S. application No. 09/058,612, Agarwal et al., filed Apr. 10, 1998.

U.S. application No. 09/083,257, Al–Shareef et al., filed May 21, 1998.

U.S. application No. 09/137,780, Al–Shareef et al., filed Aug. 20, 1998.

U.S. application No. 09/074,638, Agarwal et al., filed May 7, 1998.

U.S. application No. 08/858,027, Sandhu et al., filed May 16, 1997.

U.S. application No. 08/738,789, Sandhu et al., filed Oct. 29, 1996.

U.S. application No. 08/881,561, Sandhu et al., filed Jun. 24, 1997.

U.S. application No. 09/086,389, Sandhu et al., filed May 28, 1998.

U.S. application No. 09/122,473, Schuegraf, filed Jul. 23, 1998.

U.S. application No. 09/098,035, DeBoer et al., filed Jun. 15, 1998.

U.S. application No. 09/185,412, Graettinger et al., filed Nov. 3, 1998.

Anonymous Research Disclosure, 1989R D–0299041 titled "Double High Dielectric Capacitor", Derwent–Week 198917 (Derwent World Patent Index).

* cited by examiner

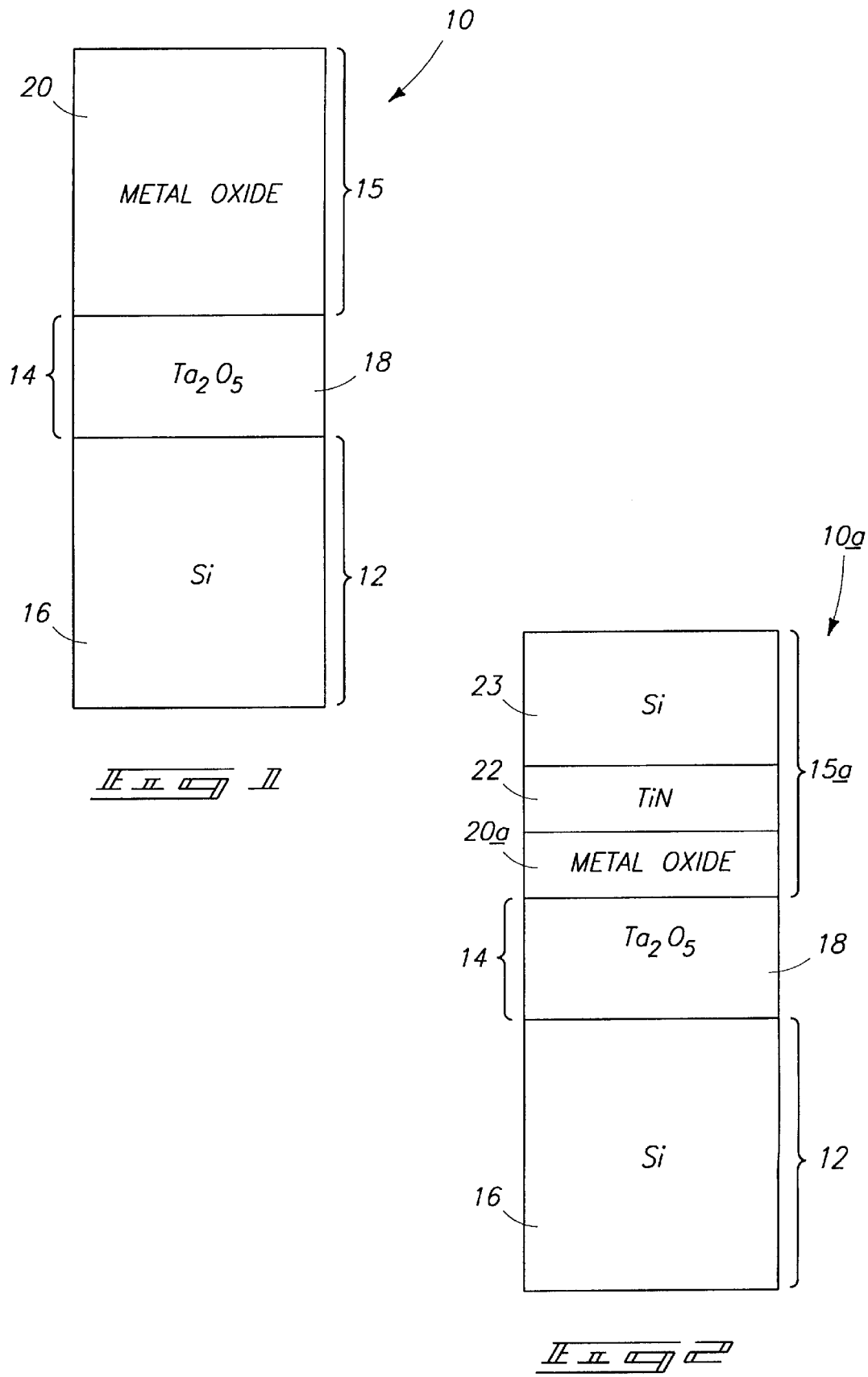

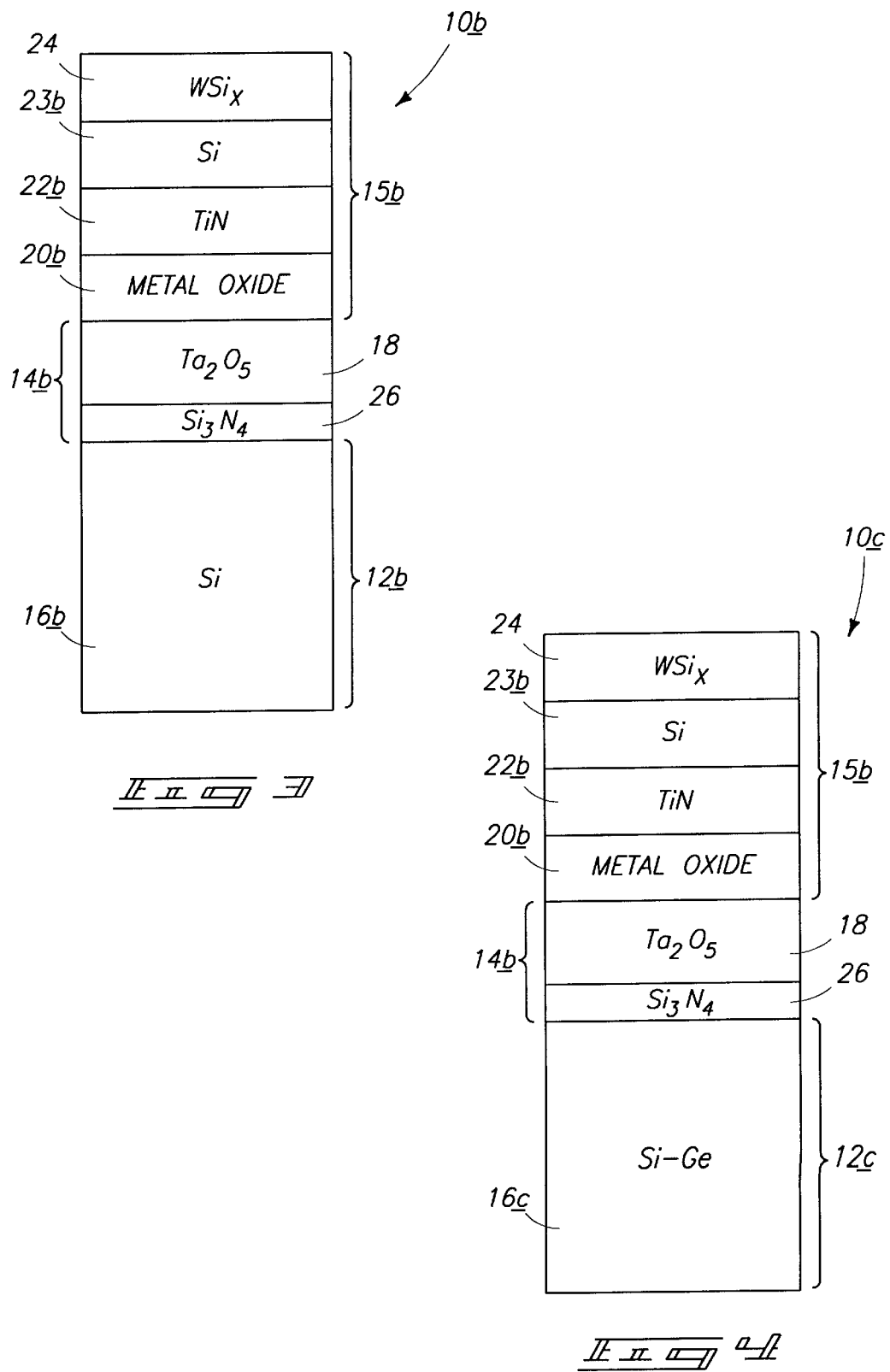

CAPACITORS, METHODS OF FORMING CAPACITORS, AND DRAM MEMORY CELLS

TECHNICAL FIELD

This invention relates to capacitors, to methods of forming capacitors, and to DRAM cells.

BACKGROUND OF THE INVENTION

As DRAMs increase in memory cell density, there is a continuing challenge to maintain sufficiently high storage capacitance despite decreasing cell area. Additionally, there is a continuing goal to further decrease cell area. One principal way of increasing cell capacitance is through cell structure techniques. Such techniques include three-dimensional cell capacitors, such as trenched or stacked capacitors. Yet as feature size continues to become smaller and smaller, development of improved materials for cell dielectrics as well as the cell structure are important. The feature size of 256 Mb DRAMs will be on the order of 0.25 micron, and conventional dielectrics such as $SiO_2$ and $Si_3N_4$ might not be suitable because of small dielectric constants.

Highly integrated memory devices, such as 256 Mbit DRAMs, are expected to require a very thin dielectric film for the 3-dimensional capacitor of cylindrically stacked or trench structures. To meet this requirement, the capacitor dielectric film thickness will be below 2.5 nm of $SiO_2$ equivalent thickness. Chemical vapor deposited (CVD) $Ta_2O_5$ films are considered to be very promising cell dielectric layers for this purpose, as the dielectric constant of $Ta_2O_5$ is approximately three times that of conventional $Si_3N_4$ capacitor dielectric layers. However, one drawback associated with $Ta_2O_5$ dielectric layers is undesired leakage current characteristics. Accordingly, although $Ta_2O_5$ material has inherently higher dielectric properties, as-deposited $Ta_2O_5$ typically produces unacceptable results due to leakage current.

Densification of $Ta_2O_5$ as deposited has been reported to significantly improve the leakage characteristics of such layers to acceptable levels. Prior art densification of such layers includes exposing the $Ta_2O_5$ layer to extreme annealing and oxidizing conditions. The anneal drives any carbon present out of the layer and advantageously injects additional oxygen into the layer such that the layer uniformly approaches a stoichiometry of five oxygen atoms for every two tantalum atoms. The oxygen anneal is commonly conducted at a temperature of from about 400° C. to about 1000° C. utilizing an ambient comprising an oxygen containing gas. The oxygen containing gas commonly comprises one or more of $O_3$, NO, $N_2O$ and $O_2$. The oxygen containing gas is typically flowed through a reactor at a rate of from about 0.5 slm to about 10 slm.

The $Ta_2O_5$ layer is typically from about 40 angstroms to about 150 angstroms thick and can be either amorphous or crystalline. $Ta_2O_5$ is generally amorphous if formed below 600° C. and will be crystalline if formed, or later processed, at or above 600° C. Typically, a $Ta_2O_5$ layer is deposited as an amorphous layer and the above-described oxygen anneal is conducted at a temperature of 600° C. or greater to convert the amorphous $Ta_2O_5$ layer to a crystalline layer. Undesirably, however, such has a tendency to form an $SiO_2$ layer intermediate or between the polysilicon and $Ta_2O_5$. Further and regardless, a thin $SiO_2$ layer will also typically inherently form during the $Ta_2O_5$ deposition due to the presence of oxygen at the polysilicon layer interface. It would be desirable to remove or eliminate this $SiO_2$ layer intermediate the $Ta_2O_5$ and polysilicon layers, yet allow for such desired densification.

One prior art technique reported includes exposing the polysilicon layer to rapid thermal nitridation prior to subsequent deposition of the $Ta_2O_5$ layer. Such are reported by Kamiyama et al., "Ultrathin Tantalum Oxide Capacitor Dielectric Layers Fabricated Using Rapid Thermal Nitridation prior to Low Pressure Chemical Vapor Deposition", J. Electrochem. Soc., Vol. 140, No. 6, June 1993 and Kamiyama et al., "Highly Reliable 2.5 nm $Ta_2O_5$ Capacitor Process Technology for 256 Mbit DRAMs", 830-IEDM 91, pp. 32.2.1–32.2.4. Such rapid thermal nitridation includes exposing the subject polysilicon layer to temperatures of from 800° C. to 1100° C. for sixty seconds in an ammonia atmosphere at atmospheric pressure. The nitride layer acts as a barrier layer to oxidation during $Ta_2O_5$ deposition and subsequent high temperature densification processes to prevent oxidation of the underlying polysilicon electrode. These processes do however have several drawbacks, including the undesired high temperature cycling and formation of a fairly thick native $SiO_2$ on the nitride in series with the $Ta_2O_5$, all of which adversely effects the realization of high capacitance promised by inherent $Ta_2O_5$ layers.

SUMMARY OF THE INVENTION

The invention comprises capacitors, methods of forming capacitors and DRAM circuitry. In one implementation, a capacitor comprises a capacitor dielectric layer comprising $Ta_2O_5$ formed over a first capacitor electrode. A second capacitor electrode is formed over the $Ta_2O_5$ capacitor dielectric layer. Preferably, at least a portion of the second capacitor electrode is formed over and in contact with the $Ta_2O_5$ in an oxygen containing environment at a temperature of at least about 175° C. Chemical vapor deposition is one example forming method. The preferred second capacitor electrode comprises a conductive metal oxide. A more preferred second capacitor electrode comprises a conductive silicon comprising layer, over a conductive titanium comprising layer, over a conductive metal oxide layer. A preferred first capacitor electrode comprises a conductively doped Si-Ge alloy. Preferably, a $Si_3N_4$ layer is formed over the first capacitor electrode.

BRIEF DESCRIPTION OF THE DRAWINGS

Preferred embodiments of the invention are described below with reference to the following accompanying drawings.

FIG. 1 is a diagrammatic depiction of a capacitor stack in accordance with one aspect of the invention.

FIG. 2 is a diagrammatic depiction of another capacitor stack in accordance with one aspect of the invention.

FIG. 3 is a diagrammatic depiction of yet another capacitor stack in accordance with one aspect of the invention.

FIG. 4 is a diagrammatic depiction of still another capacitor stack in accordance with one aspect of the invention.

DETAILED DESCRIPTION OF THE PREFERRED EMBODIMENTS

Figure 5:
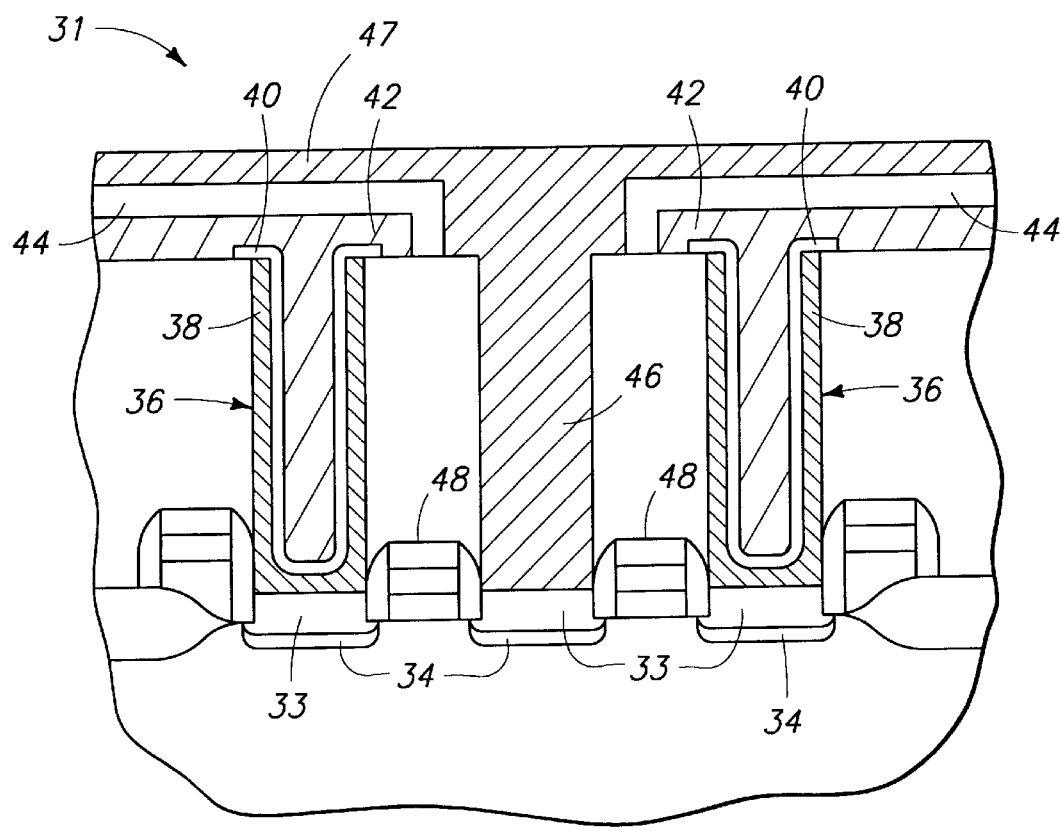
FIG. 5 is a view an alternate embodiment semiconductor wafer fragment in accordance with the invention.

This disclosure of the invention is submitted in furtherance of the constitutional purposes of the U.S. Patent Laws "to promote the progress of science and useful arts" (Article 1, Section 8).

FIG. 1 diagrammatically depicts a capacitor stack 10 which would be formed over a substrate. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including but not limited to, the semiconductive substrates described above.

Capacitor 10 comprises a first capacitor electrode 12, a capacitor dielectric layer 14, and a second capacitor electrode 15. In the illustrated example, first capacitor electrode 12 comprises silicon material 16, such as elemental silicon in polycrystalline form which is suitably conductively doped with desired dopant impurities. Such can be formed, for example, by chemical vapor deposition using $SiH_4$ as a precursor gas at a temperature of 535° C. and a pressure of 200 mTorr. Doping can occur during or after deposition. An example preferred thickness range for layer 12 is from 400 Angstroms to 1000 Angstroms. Electrode 12 could of course constitute some other conductive material. Further, electrode 12 could comprise a composite of conductive materials, such as by way of example only Ru or $RuO_X$ formed over conductively doped silicon.

Capacitor dielectric layer 14 is preferably formed over and in contact with electrode 12, and preferably comprises $Ta_2O_5$ material 18. Where electrode 12 comprises silicon, an intervening oxidation barrier layer (not shown) is ideally provided intermediate the $Ta_2O_5$ and silicon. Example conductive oxidation barrier layers include $RuO_X$ and Ru. $Ta_2O_5$ can be deposited by low pressure chemical vapor deposition utilizing $Ta(C_3H_5)_5$, $O_2$ and $N_2$ as precursor gases. Example flow rates are 120 sccm; 2–5 slm; and 2–5 slm, respectively. An example temperature is 410° C., with an example pressure being from 200 to 400 mTorr. An example deposition thickness is from 60 to 90 Angstroms, with 70 Angstroms being preferred. The $Ta_2O_5$ layer is thereafter preferably subjected to a high temperature oxidation anneal by any one of the following processes, or other processes. In a first, rapid thermal processing is conducted over 40 seconds up to a temperature of 850° C. in a $N_2O$ ambient, with pressure being 660 Torr. Processing continues at 850° C. and 660 Torr for one minute. In a second process, furnace heating is conducted to 800° C. at a temperature increase rate of 7° C./min. in a $N_2O$ ambient, with pressure remaining at atmospheric and the wafer being maintained at 800° C. for 30 minutes. In a third, a higher pressure oxidation is conducted at 800° C. for 30 minutes in a $N_2O$ atmosphere at a pressure from 1 to 3 atmospheres, with the temperature being ramped to 800° C. at an approximate rate of 15° C./min.

Second capacitor electrode 15 is preferably formed over and in contact with $Ta_2O_5$ material 18 of capacitor dielectric layer 14. Such preferably is formed in an oxygen-containing environment at a temperature of at least about 175° C. Second capacitor electrode 14 preferably comprises a conductive metal oxide material 20 formed to a thickness of from about 400 Angstroms to about 1000 Angstroms. In the context of this document, a conductive metal oxide is any oxide having a resistance of less than or equal to about microohms.cm. Example materials include $RuO_2$, $IrO_2$, $SnO_2$, $In_2O_3$:$SnO_2$, $VO_3$, CuO, $Cu_2O$, and mixtures thereof. $RuO_2$ and $IrO_2$ are more preferred. An example process for forming such conductive metal oxide is by chemical vapor deposition. For $RuO_X$ an example deposition process would be conducted at a pressure of 1 Torr and a temperature of 175° C., with precursor feeds of Ru(tricarbonyl cyclohexdienyl) at 300 sccm and $O_2$ at 300 sccm.

Referring to FIG. 2, a second embodiment capacitor stack 10a is shown. Like numerals from the first described embodiment are utilized where appropriate, with differences being indicated by the suffix "a" or with different numerals. Here, second capacitor electrode 15a comprises a conductive silicon comprising layer 23 formed over and in contact with a conductive titanium comprising layer 22 (i.e., Ti or TiN), formed over and in contact with conductive metal oxide layer 20a. Conductive metal oxide layer 20a is also formed over and preferably in contact with $Ta_2O_5$ material 18 of capacitor dielectric layer 14. Accordingly, second capacitor electrode 15a comprises both conductive silicon and a conductive metal oxide. A titanium comprising layer 22 is provided intermediate conductive metal oxide layer 20a and conductive silicon layer 23. The preferred material for titanium-comprising layer 22 is TiN formed by chemical vapor deposition using an organic precursor. An example process utilizes precursors of $((CH_3)_2N)_4Ti$ at 150 sccm and $N_2$ at 80 sccm at a temperature of 420° C. and a pressure of 0.7 Torr. Silicon layer 23 preferably comprises conductively doped elemental polycrystalline silicon, with thus both the first and second capacitor electrodes comprising silicon. An example thickness for TiN layer 22 is from 150 Angstroms to 300 Angstroms. An example thickness for silicon layer 23 is from 400 Angstroms to 1000 Angstroms.

Yet another alternate embodiment capacitor stack 10b is shown in FIG. 3. Like numerals from the first described embodiments are utilized where appropriate, with differences being indicated by the suffix "b" or with different numerals. Here, silicon material 16b of first capacitor electrode 12b is subjected to rapid thermal nitridation to form a silicon nitride layer 26 atop material 16b and in contact with $Ta_2O_5$ material 18. Thereby, the capacitor dielectric layer 14b essentially comprises a combination of the $Ta_2O_5$ and $Si_3N_4$. The nitridation is ideally conducted prior to formation of the $Ta_2O_5$, and functions as a diffusion restricting or barrier layer to formation of $SiO_2$ during deposition of $Ta_2O_5$ material 18. Thickness of layer 26 is preferably from 30 Angstroms to 60 Angstroms. Exemplary rapid thermal nitridation conditions include exposing the substrate to a $NH_3$ atmosphere at a flow rate of from about 10 to 20 sccm for 20 seconds at atmospheric pressure and 900–950° C. In the context of this document, rapid thermal nitridation is intended to define any process where a substrate is ramped to a temperature of at least 900° C. at a rate of 20° C./sec in a nitrogen containing environment.

Second capacitor electrode 15b is formed to provide silicon both as polycrystalline silicon and as a silicide. Specifically, a silicide layer 24 is formed over silicon layer 23b. Example techniques include a refractory metal deposition and conventional salicide process, or direct chemical vapor deposition of a silicide. Example precursor gases for chemical vapor depositing $WSi_X$ include $WF_6$ and $WSH_4$. An example preferred thickness for silicide layer 24 is from about 300 Angstroms to 600 Angstroms.

Still a further alternate embodiment capacitor stack 10c is described with reference to FIG. 4. Like numerals from the first described embodiments have been utilized where appropriate, with differences being indicated by the suffix "c" or with different numerals. Here, first capacitor electrode 12c comprises a conductively doped silicon-germanium alloy material 16c.

In each of the above described preferred embodiments where at least one of the first and second capacitor electrodes comprises titanium, no titanium-comprising material of either the first and second capacitor electrodes is formed in contact with the $Ta_2O_5$ material of the capacitor dielectric layer. Where the capacitor dielectric layer comprises $Ta_2O_5$, preferably such effectively gets heated in an oxygen rich atmosphere during top electrode deposition, which can minimize oxygen vacancy content in the $Ta_2O_5$. Where a conductive metal oxide is formed in contact with $Ta_2O_5$, reduction of the $Ta_2O_5$ can be avoided or at least reduced.

FIG. 5 depicts implementation of the invention in fabrication of DRAM circuitry. A wafer fragment 31 comprises two memory cells, with each comprising a capacitor 36 and a shared bit contact 46. Capacitors 36 electrically connect with substrate diffusion regions 34 through silicide regions 33. For simplicity, capacitors 36 are shown as comprising a first capacitor electrode 38, a capacitor dielectric layer 40, and a second capacitor electrode/cell plate 42. Such can be fabricated of materials described above, preferably to include silicon, barrier layers metal oxide, and a high K oxygen containing capacitor dielectric layers such as $Ta_2O_5$. Processing preferably occurs as described above. A dielectric layer 44 is formed over second capacitor plate 42. A bit line 47 is fabricated in electrical connection with bit contact 46. Word lines 48 are fabricated to enable selective gating of the capacitors relative to bit contact 47.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A capacitor comprising:
   a first capacitor electrode comprising a conductively doped Si-Ge alloy;
   a $Si_3N_4$ layer over the first capacitor electrode;
   a capacitor dielectric layer comprising $Ta_2O_5$ over the $Si_3N_4$ layer; and
   a second capacitor electrode over the $Ta_2O_5$ capacitor dielectric layer.

2. The capacitor of claim 1 wherein the $Si_3N_4$ layer is less than or equal to about 50 Angstroms thick.

3. The capacitor of claim 1 wherein the second capacitor electrode comprises a conductive metal oxide.

4. The capacitor of claim 1 wherein the $Si_3N_4$ is formed in contact with the Si-Ge alloy.

5. The capacitor of claim 1 wherein the $Ta_2O_5$ is formed in contact with the $Si_3N_4$.

6. The capacitor of claim 1 wherein the $Si_3N_4$ is formed in contact with the Si-Ge alloy, and the $Ta_2O_5$ is formed in contact with the $Si_3N_4$.

7. The capacitor of claim 1 wherein the second capacitor electrode comprises a conductive metal oxide, the $Si_3N_4$ is formed in contact with the Si-Ge alloy, and the $Ta_2O_5$ is formed in contact with the $Si_3N_4$.

* * * * *